United States Patent
Schossig

(10) Patent No.: US 12,090,568 B2
(45) Date of Patent: Sep. 17, 2024

(54) ARRANGEMENT AND METHOD FOR MECHANICALLY AND ELECTRICALLY CONTACTING A GLOW WIRE OF A THERMAL RADIATION SOURCE MADE OF REFRACTORY METAL FOR SEMICONDUCTOR AND MICROSYSTEM TECHNOLOGY

(71) Applicant: Infrasolid GmbH, Dresden (DE)

(72) Inventor: Marco Schossig, Dresden (DE)

(73) Assignee: Infrasolid GmbH, Dresden (DE)

( * ) Notice: Subject to any disclaimer, the term of this patent is extended or adjusted under 35 U.S.C. 154(b) by 5 days.

(21) Appl. No.: 18/015,203

(22) PCT Filed: Jul. 30, 2021

(86) PCT No.: PCT/EP2021/071364
§ 371 (c)(1),
(2) Date: Jan. 9, 2023

(87) PCT Pub. No.: WO2022/033892
PCT Pub. Date: Feb. 17, 2022

(65) Prior Publication Data
US 2023/0278132 A1    Sep. 7, 2023

(30) Foreign Application Priority Data
Aug. 11, 2020   (DE) .......................... 102020121157.0

(51) Int. Cl.
*B23K 20/00* (2006.01)
*B23K 101/36* (2006.01)
(Continued)

(52) U.S. Cl.
CPC ............. *B23K 20/007* (2013.01); *H01K 1/16* (2013.01); *H01K 3/065* (2013.01); *H01R 4/06* (2013.01); *B23K 2101/36* (2018.08); *H01K 1/08* (2013.01)

(58) Field of Classification Search
None
See application file for complete search history.

(56) References Cited

U.S. PATENT DOCUMENTS

| | | |
|---|---|---|
| 1,477,618 A | 12/1923 | Wetmore |
| 2,145,186 A | 1/1939 | Meeker et al. |

(Continued)

FOREIGN PATENT DOCUMENTS

| | | |
|---|---|---|
| DE | 735 789 | 5/1943 |
| DE | 22 00 736 | 8/1972 |

(Continued)

OTHER PUBLICATIONS

Int'l Search Report (Form PCT/ISA/210) conducted in Int'l Appln. No. PCT/EP2021/071364 (Dec. 21, 2021).

(Continued)

*Primary Examiner* — Ashok Patel
(74) *Attorney, Agent, or Firm* — GREENBLUM & BERNSTEIN, P.L.C.

(57) ABSTRACT

The invention discloses an arrangement for mechanically and electrically contacting a glow wire of a thermal radiation source, comprising a glow wire made of refractory metal having at least one flat connection surface to be contacted, a contact surface on which the glow wire is contacted, and a contacting means which connects the glow wire to the contact surface. The invention also relates to a method for producing the contact according to the invention. The problem addressed by the invention, of providing a reliable and enduringly stable mechanical and electrical contact of glow (Continued)

wires made of refractory metals, is solved in that the flat connection surface has at least two perforations and/or at a circumferential edge of the connection surface of the glow wire at least two recesses are formed, wherein the contacting means is integrally connected to the contact surface at the location of the perforations and/or recesses and forms both an electrical and a mechanical connection to the glow wire at the location of the perforations and/or recesses by means of a flange-like design of the contacting means above the connection surface of the glow wire.

7 Claims, 4 Drawing Sheets

(51) Int. Cl.
*H01K 1/08* (2006.01)
*H01K 1/16* (2006.01)
*H01K 3/06* (2006.01)
*H01R 4/06* (2006.01)

(56) References Cited

U.S. PATENT DOCUMENTS

| | | |
|---|---|---|
| 3,561,084 A | 2/1971 | Sims |
| 4,370,589 A | 1/1983 | Decaro et al. |

FOREIGN PATENT DOCUMENTS

| | | | |
|---|---|---|---|
| DE | 195 45 296 | | 6/1997 |
| DE | 10 2004 061 736 | | 7/2006 |
| DE | 10 2010 040 779 | | 3/2012 |
| WO | 2006/066533 | * | 6/2006 |

OTHER PUBLICATIONS

Int'l Written Opinion (Form PCT/ISA/237) conducted in Int'l Appln. No. PCT/EP2021/071364 (Dec. 21, 2021).

* cited by examiner

ARRANGEMENT AND METHOD FOR MECHANICALLY AND ELECTRICALLY CONTACTING A GLOW WIRE OF A THERMAL RADIATION SOURCE MADE OF REFRACTORY METAL FOR SEMICONDUCTOR AND MICROSYSTEM TECHNOLOGY

The invention relates to an arrangement for mechanical and electrical contacting of an incandescent wire of a thermal radiation source according to the preamble of claim 1, wherein the arrangement comprises an incandescent wire made of refractory metal having at least one flat connection surface to be contacted, a contact surface on which the incandescent wire is contacted and a contacting medium which joins the incandescent wire to the contact surface.

The invention also relates to a process for producing the contacting according to the invention.

The radiant power of a thermal radiation source is proportional to the fourth power of its absolute temperature and is described by the Stefan-Boltzmann law. For a high radiant power the incandescent wire of the thermal radiation source must accordingly have a temperature that is as high as possible. This requires a material having a very high melting point. Suitable materials include in particular refractory metals, i. e. high melting point, non-noble metals, such as for example tungsten, tantalum or molybdenum.

The best-known thermal radiation source is the incandescent lamp where an incandescent wire made of tungsten is heated and made to incandesce by electrical current. Depending on the design the temperature of the incandescent wire is about 1500° C. to 3000° C. The high temperatures at the contact sites and the current flow can lead to material transport. Non-noble materials then creep along the incandescent wire and undergo chemical reaction therewith. This leads to embrittlement and formation of breakage points which reduce the service life of the thermal radiation source. Breakage at these embrittled sites then occurs especially upon switching on or off. Care therefore needs to be taken to select the correct materials for the two joining partners—the incandescent wire and the contact site. U.S. Pat. No. 2,145,186 A discloses for example an incandescent lamp in a sealed envelope, in particular a mechanical securing of the incandescent filament to the inner lead-in wires.

Refractory metals are relatively corrosion-resistant at room temperature due to passivation. However, at high temperatures they very easily react with many nonmetals and gases, and very high demands in terms of purity and gastightness are therefore placed on the housing but also on the electrical contacting. Secure and durable electrical contacting of the very hot incandescent wire is achieved by a welded join, usually by so-called resistance spot welding. This joins metals because the atoms of both joining parts undergo chemical or metallurgical interaction and form a solid cohesive join. Examples of welded joins between an incandescent wire and a lead-in wire are disclosed in U.S. Pat. No. 1,477,618 A, in DE 10 2004 061 736 A1, in DE 22 00 736 A and in DE 735 789 A. Likewise, U.S. Pat. No. 4,370,589 A discloses a welded join between an incandescent filament of an electrical incandescent lamp and the feed-in wires, wherein the inner ends of the feed-in wires are toothed and welded at the ends of the incandescent filament such that the incandescent filament and the feed-in wires are melted together at several sites and these sites provide strong, reliable electrical connections.

However, not all materials are equally amenable to joining to one another by resistance spot welding. This is due to physical properties and interactions with the electrode materials. Ideal material properties for resistance spot welding are:
  identical or similar melting points
  low electrical conductivity
  low thermal conductivity
  high deformability (hot deformability).

These conditions are rarely encountered in real welding tasks. Hard and brittle materials, such as refractory metals, also have a tendency for fracture formation during the welding and cooling process. This affects the quality and reliability of the electrical contacting.

In addition, welding is not a standard process in microelectronics and microsystems technology. Common methods here are, for example, wire bonding and flip-chip bonding.

In wire bonding, thin wires (bonding wire) are used to join the connections of a component 5 with the electrical connections 4 of other components or of a housing, see FIGS. 1 and 2. Typically employed bonding materials are gold, aluminum or copper. A very commonly used wire bonding process is so-called ball-wedge bonding. The end of the bonding wire 2 protruding from the bottom of the capillary 1 of the wire bonder is melted and forms a ball 3 due to surface tension. This ball 3 is bonded to the contact surface 4 with pressure, heat and ultrasound to form a so-called ball bond 6. In the case of ball-wedge bonding, the bonding wire 2 is then pulled to another contact surface 4 and bonded, see FIG. 2. However, this is not the case with so-called ball bonding, a special form of ball-wedge bonding shown in FIG. 1. Here, the wire clamp on the capillary 1 is closed after the first ball bond 6 and the bonding wire 2 is severed directly at the bonded ball upon lifting the capillary 1. This creates spherical humps, so-called bumps, on the contact surface 4. These are also known as stud bumps 7. The process is used primarily in flip-chip assembly. DE 1 949 869 A describes a process for joining an incandescent filament to a metallic lead-in wire, wherein a metal bead is heated to a plastic or semi-plastic state while the metal bead is pressed against the feed-in wire and the incandescent filaments disposed thereupon to form an intermetallic or metallurgical join through diffusion at the interface of the metal bead and the lead-in wire.

Aluminum is unsuitable for contacting with an incandescent wire made of refractory metal since it is a very non-noble metal and also has a very low melting point.

The noble metal gold is often employed in microelectronics and microsystems technology as a conductor track, especially also as a bonding wire, and for contact surfaces since it has exceptional electrical and thermal properties, is very easy to process and exhibits high corrosion-resistance and is easy to solder. However, due to its high electrical and thermal conductivity, gold is of limited suitability for welding. A reliable and durable welded join with a refractory metal is not possible.

Recent years have seen bonding with copper wire slowly become established, especially due to its enormous cost advantage. However, copper wire also offers further advantages over gold wire. Its direct current resistance and thermal conductivity are better than for gold wire. Furthermore, copper exhibits high mechanical stability and improved contact reliability at elevated temperatures. However, a disadvantage is the rapid surface oxidation of copper, which occurs even at room temperature. If the copper oxide layer is too thick, bonding is no longer possible since the material becomes too hard. In addition, the end of the bonding wire can no longer be melted into a ball, as is necessary for formation of stud bumps. It is therefore important to protect the copper wire from oxidation. This requires appropriate oxygen-free storage and processing of the copper bonding wire. As in the case of gold, a reliable and durable welded join with a refractory metal is likewise not possible with copper.

The described known contacting forms of wire bonding for microelectronic components also do not allow hard and brittle materials, such as refractory metals, to be reliably and durably directly contacted with gold, copper or aluminum wire.

It is accordingly an object of the present invention to provide reliable and durable mechanical and electrical contacting of incandescent wires made of refractory metals which are also producible with commonly used processes in microelectronics and microsystems technology to allow easy integration into, for example, microelectronic, optoelectronic or microoptoelectromechanical (MOEMS) systems and a high degree of automation.

The object is achieved by an arrangement for mechanical and electrical contacting of an incandescent wire of a thermal radiation source according to the independent arrangement claim. According to the invention the flat connection surface of the incandescent wire has at least two perforations and/or a circumferential edge of the connection surface of the incandescent wire has at least two cutouts, wherein the contacting medium is joined to the contact surface with an atomic-level join at the site of the perforations and/or cutouts and through a flange-like configuration of the contacting medium above the connection surface of the incandescent wire at the site of the perforations and/or cutouts forms both an electrical and a mechanical connection with the incandescent wire. A flat connection surface is to be understood as meaning a portion of the incandescent wire which is disposed on the contact surface in a flat and planar manner, wherein the extent of the connection surface in the plane is substantially greater than its thickness.

It is particularly advantageous when the perforations and/or cutouts in the connection surface of the incandescent wire are used to clamp and thus secure the incandescent wire to a planar contact surface with wire-bonded balls, so-called stud bumps. The resulting join reliably contacts the incandescent wire made of a refractory metal to the contact surface both electrically and mechanically. The combination of structural modification of the flat connection surface of the incandescent wire with known ball-bonding makes it possible to effect low-cost reliable and durable contacting of a refractory metal that was hitherto durably contactable only at enormous cost, if at all, using an established and highly automated process from semiconductor and microsystems technology.

The wire-bonded balls, known as stud bumps in semiconductor and microsystems technology, form an atomic-level join with the contact surface through pressure, heat and ultrasound, the bond ball resembling a flattened sphere in cross section. This flange-like flattening is used in the arrangement according to the invention for mechanical clamping of the connection surface of the incandescent wire to the contact surface, similarly to a riveted join. The flat contact of the connection surface of the incandescent wire and the stud bumps in the perforations and/or the cutouts at the edge of the connection surface of the incandescent wire also ensures electrical connection. Operation of the thermal radiation source with the contacting according to the invention additionally results in thermal expansion of the incandescent wire and the contacting medium so that the contact resistance between the connection surface of the incandescent wire and the contact surface is virtually zero.

The advantage over contactings of refractory metals known hitherto is in particular that the arrangement according to the invention ensures that embrittlement of the contact sites of the refractory metal and material transport no longer occur, thus allowing the service life of a component with contact sites made of refractory metal to be substantially increased. This contacting form is very easy to produce with established and highly automated processes from semiconductor and microsystems technology and is thus easy to integrate into the production process of microelectronic, optoelectronic or microoptoelectromechanical (MOEMS) systems in which refractory metals require contacting.

In one embodiment of the arrangement according to the invention the perforations are circular, triangular (n=3), square (n=4) and/or n-angular. n is a natural number greater than 2. The mechanical and electrical contacting can be optimized according to the size of the stud bump which depends on the diameter of the bonding wire and the process parameters during wire bonding. Typical bonding wire diameters are in the range of (10 . . . 50) μm. This results in stud bumps having a diameter of typically <100 μm. The diameter of the perforations and processes must be smaller than the diameter of the stacked bumps to effect reliable clamping.

In a different embodiment of the arrangement according to the invention, the cutouts are triangular (n=3), square (n=4), trapezoidal (n=4), arcuate and/or n-angular. n is a natural number greater than 2. The mechanical and electrical contacting can be optimized according to the size of the stud bump which depends on the diameter of the bonding wire and the process parameters during wire bonding.

The connection surface of the incandescent wire may comprise both perforations and cutouts or both, whose shapes may be freely combined.

In a further embodiment of the contacting according to the invention the contact surface and the contacting medium are preferably made of gold and/or copper. Gold and copper have excellent electrical and thermal properties and are very easy to process. Gold especially also exhibits high corrosion-resistance and is easy to solder.

In a further different embodiment of the contacting according to the invention the refractory metal of the incandescent wire is tungsten or tantalum. These materials are preferably employed in thermal radiation sources with high radiant power since they have a very high melting point.

In one embodiment of the contacting according to the invention the incandescent wire is heatable to a temperature above 700° C. without a chemical reaction occurring between the incandescent wire and the contacting site. The contacting site is the location at which the contacting medium is joined to the contact surface by an atomic-level join and through the perforations and/or cutouts forms a mechanical and electrical connection between the connection surface of the incandescent wire and the contact surface. This is only possible through the combination of the modified connection surface of the incandescent wire and the bonding of the contacting medium with the contact surface below at the site of the perforations and/or cutouts. Since the incandescent wire made of refractory metal does not undergo chemical bonding with the contact surface, very high temperatures above 700° C. can no longer lead to material flow/material transport between the refractory metal and the material of the contacting medium. This prevents creep of non-noble materials along the incandescent wire and chemical reactions with said wire are prevented. Embrittlement and formation of breakage points which reduce the service life of the thermal radiation source no longer occur.

The object is also achieved by a process for producing the arrangement for mechanical and electrical contacting of an incandescent wire of a thermal radiation source as claimed in claims 1 to 6, wherein the contacting medium is applied to the contact surface at the site of the perforations and/or cutouts by wire bonding and the contacting medium is severed directly above the flange-like projection above the connection surface of the incandescent wire at the site of the perforations and/or cutouts.

The arrangement according to the invention and the production thereof are intended for use in semiconductor and microsystems technology and are suitable and configured therefor.

The invention shall be more particularly elucidated below with reference to exemplary embodiments. In the accompanying drawings FIG. 1 shows the ball bonding process known from flip-chip assembly for producing spherical humps, so-called stud bumps, on a planar contact surface;

FIG. 3 shows an embodiment of the inventive connection surface 10 of an incandescent wire with different shapes of the perforations. The mechanical and electrical contacting can be optimized according to the size of the stud bump 7, i.e. the contacting medium, which depends on the diameter of the bonding wire and the process parameters during wire bonding.

FIG. 4 shows a further embodiment of the inventive connection surface 10 of an incandescent wire with different shapes of the cutouts. The mechanical and electrical contacting can be optimized according to the size of the stud bump 7 which depends on the diameter of the bonding wire and the process parameters during wire bonding.

Figure 1:
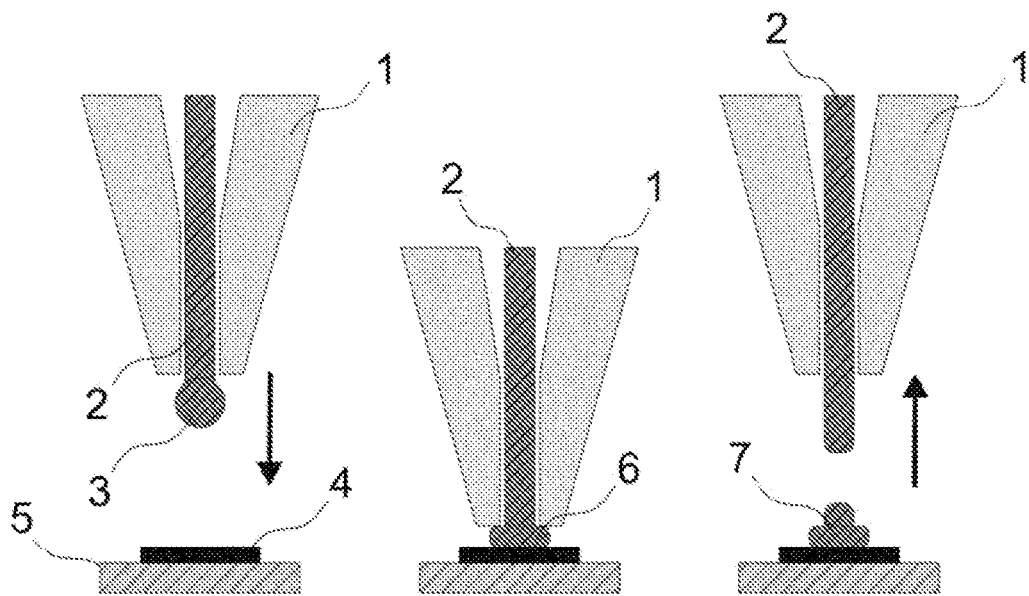
Figure 2:
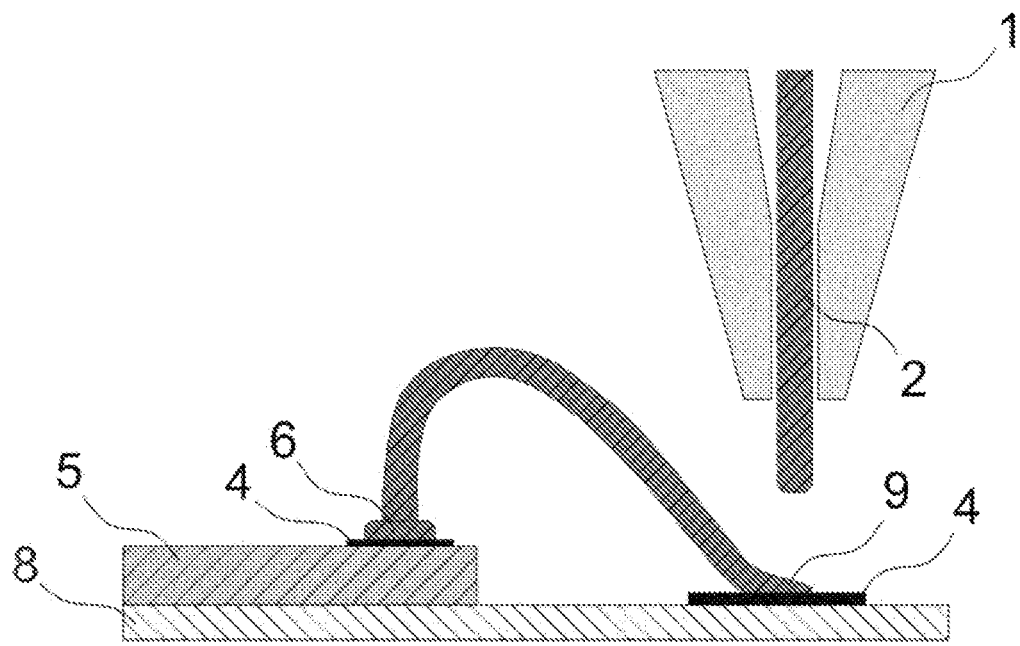
FIG. 2 shows the contacting form of wire bonding, which is known from the prior art, for microelectronic components.
Figure 3:
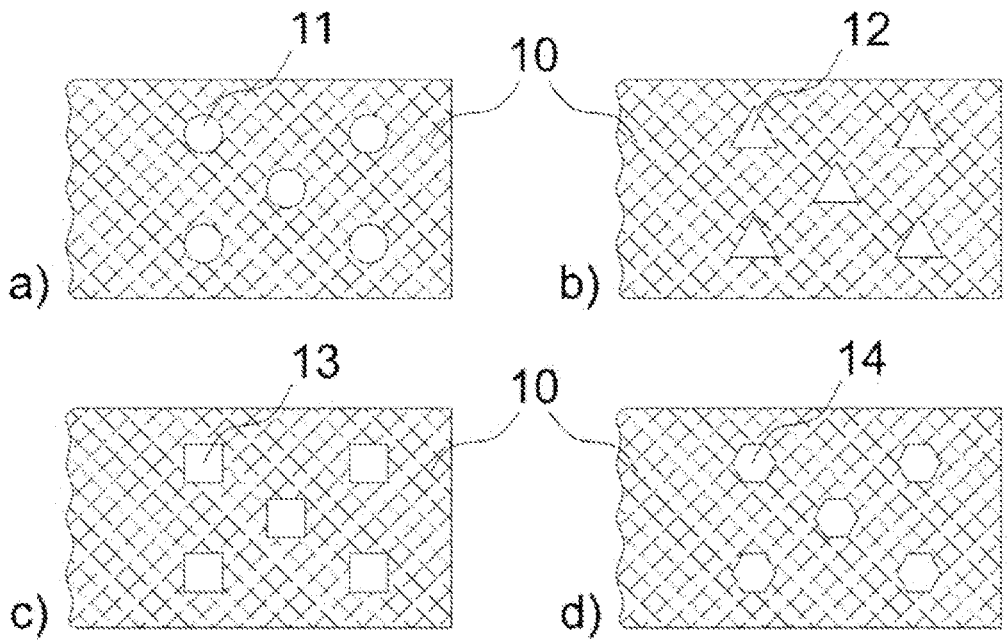
FIG. 3 shows an embodiment of the connection surface of an incandescent wire with perforations according to the invention: (a) round perforation, (b) triangular perforation, (c) rectangular perforation, (d) n-angular perforation.
Figure 4:
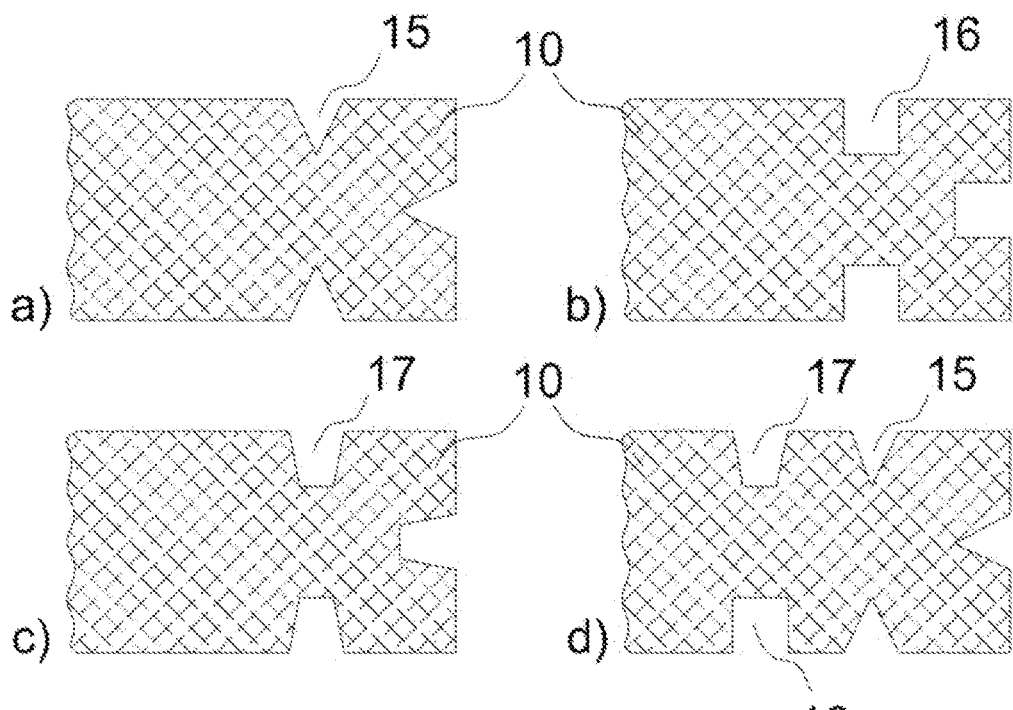
FIG. 4 shows an embodiment of the connection surface of an incandescent wire with cutouts according to the invention: (a) triangular cutout, (b) rectangular cutout, (c) trapezoidal cutout, (d) combination of different cutouts.
Figure 5:
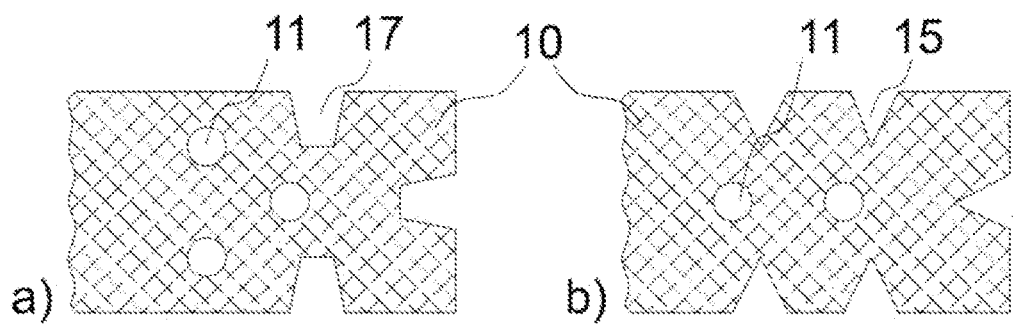
FIG. 5 shows an embodiment of the connection surface of an incandescent wire made of a refractory metal with perforations and cutouts according to the invention: (a) round perforations and trapezoidal cutouts, (b) round perforations and triangular cutouts.

FIG. 5 shows a preferred embodiment of the inventive connection surface 10 of an incandescent wire with different shapes of the perforations 11 and the cutouts 17. Since the diameter of the bonding wire cannot be reduced arbitrarily the combination of perforations 11 and cutouts 17 is advantageous in particular in the case of very small surfaces of the contact sites, since this allows a higher number of contacting points. By placing a first stud bump 7 in a perforation 11 the incandescent wire is fixed and secured against slipping. Further stud bumps 7 in the recesses 17 then ensure the necessary mechanical stability and good electrical contact.

Figure 6:
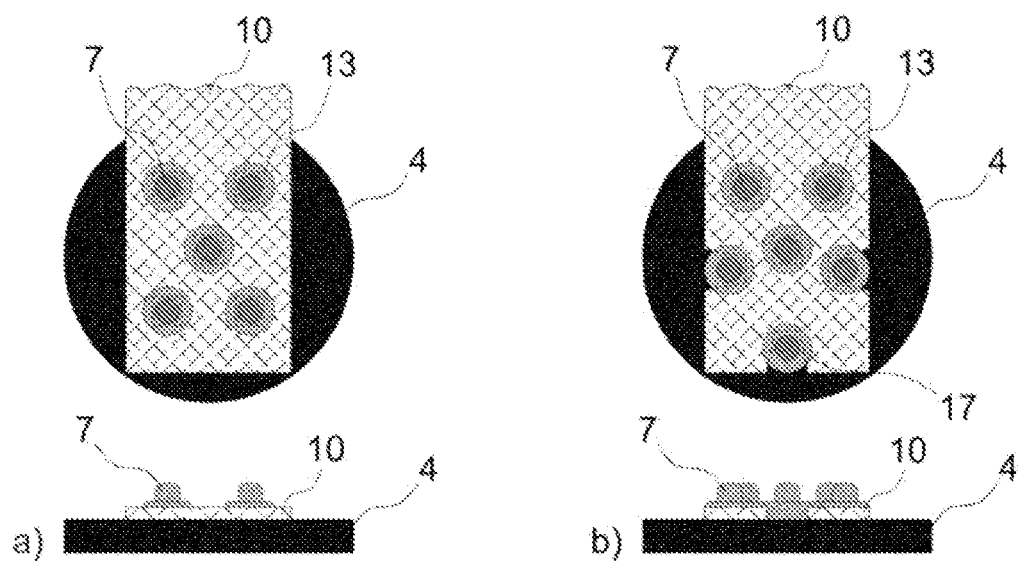
FIG. 6 shows an inventive embodiment of the contacting of an incandescent wire made of a refractory metal using stud bumps.

FIG. 6 shows a preferred embodiment of the inventive contacting between the structured connection surface 10 of an incandescent wire made of a refractory metal and the bonded stud bump 7. It is particularly advantageous when the perforations 11 and/or cutouts 17 in the connection surface 10 of the incandescent wire are used to clamp and thus secure the incandescent wire to a planar contact surface 4 with the wire-bonded balls, the stud bumps 7. The resulting join reliably contacts the incandescent wire made of a refractory metal to the contact surface 4 both electrically and mechanically. This join is durable, reliable and producible at low cost.

Figure 7:
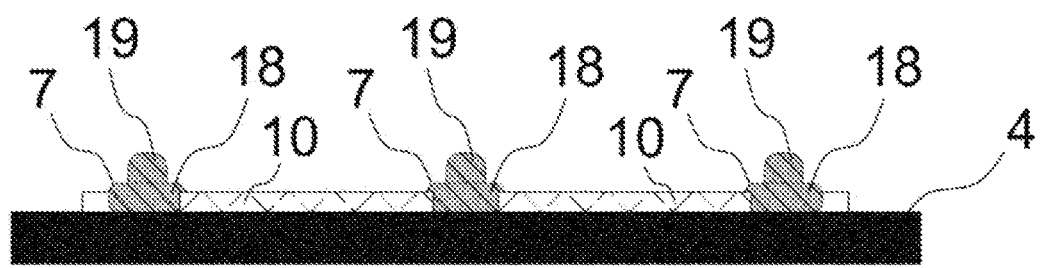
FIG. 7 shows a cross-section of the inventive contacting of the incandescent wire on the contact surface at a perforation and two cutouts.

The stud bumps 7 made of gold or copper for example form an atomic-level join with the contact surface 4 which is likewise made of gold or copper for example, the bonded bond ball 3 in cross section resembling a flattened sphere 18 with the severed bonding wire end 19 (FIG. 7). This flange-like flattening 18 is used for mechanical clamping of the connection surface 10 of the incandescent wire to the contact surface 4, similarly to a riveted join. The flat contact of the connection surface 10 of the incandescent wire and the stud bumps 7 in the perforations 11 and/or the cutouts 17 at the edge of the connection surface 10 of the incandescent wire also ensures electrical connection. Operation of the thermal radiation source with the contacting according to the invention additionally results in thermal expansion of the incandescent wire and the contacting medium (for example gold wire) so that the contact resistance between the connection surface 10 of the incandescent wire and the contact surface 4 is virtually zero.

The advantage over contactings of refractory metals known hitherto is in particular that the arrangement according to the invention ensures that embrittlement of the contact sites and material transport no longer occur, thus allowing the service life of a component with contact sites comprising a refractory metal to be substantially increased. Costly passivation of the contact sites etc. is no longer required.

LIST OF REFERENCE NUMERALS

1 Capillary of a wire bonder
2 Bonding wire
3 Ball
4 Contact surface, electrical connection
5 Component
6 Ball bond
7 Stud bump
8 Substrate
9 Wedge bond
10 Connection surface/contact surface of an incandescent wire
11 Round perforation
12 Triangular perforation
13 Rectangular perforation
14 n-Angular perforation
15 Triangular cutout
16 Rectangular cutout
17 Trapezoidal cutout
18 Flattened sphere
19 Severed bonding wire

The invention claimed is:
1. An arrangement for mechanical and electrical contacting of an incandescent wire of a thermal radiation source, comprising:

an incandescent wire made of refractory metal having at least one flat connection surface to be contacted, the at least one flat connection surface having a surface and an circumferential edge;

a contact surface on which the incandescent wire is contacted; and a contacting medium which joins the incandescent wire to the contact surface, wherein the at least one flat connection surface has sites including at least one of: at least two perforations in the surface or at least two cutouts in the circumferential edge, wherein the contacting medium is joined to the contact surface with an atomic-level join at the sites and, through a flange-like configuration of the contacting medium above the at least one flat connection surface of the incandescent wire at the sites, forms both an electrical and a mechanical connection with the incandescent wire.

2. The arrangement for mechanical and electrical contacting of an incandescent wire of a thermal radiation source as claimed in claim 1, wherein the at least two perforations are at least one of circular, triangular, square or n-angular shaped.

3. The arrangement for mechanical and electrical contacting of an incandescent wire of a thermal radiation source as claimed in claim 1, wherein the at least two cutouts are at least one of triangular, square, trapezoidal, arcuate or n-angular shaped.

4. The arrangement for mechanical and electrical contacting of an incandescent wire of a thermal radiation source as claimed in claim 1, wherein the contact surface and the contacting medium are made of at least one of gold or copper.

5. The arrangement for mechanical and electrical contacting of an incandescent wire of a thermal radiation source as claimed in claim 1, wherein the refractory metal of the incandescent wire is tungsten or tantalum.

6. The arrangement for mechanical and electrical contacting of an incandescent wire of a thermal radiation source as claimed in claim 1, wherein the incandescent wire is heatable to a temperature above 700° C. without a chemical reaction occurring between the incandescent wire and the contacting site.

7. A process for producing the arrangement for mechanical and electrical contacting of an incandescent wire of a thermal radiation source as claimed in claim 1, the process comprising:

applying the contacting medium to the contact surface at the site of the at least two perforations or the at least two cutouts by wire bonding; and severing the contacting medium directly above the flange-like projection above the connection surface of the incandescent wire at the sites.

\* \* \* \* \*